US007744378B2

(12) United States Patent
Neumetzler et al.

(10) Patent No.: US 7,744,378 B2
(45) **Date of Patent: *Jun. 29, 2010**

(54) PLUG FOR CONNECTION STRIPS AND METHOD FOR THE PRODUCTION THEREOF

(75) Inventors: Heiko Neumetzler, Berlin (DE); Harald Klein, Berlin (DE); Joachim Stark, Berlin (DE)

(73) Assignee: ADC GmbH, Berlin (DE)

(*) Notice: Subject to any disclaimer, the term of this patent is extended or adjusted under 35 U.S.C. 154(b) by 0 days.

This patent is subject to a terminal disclaimer.

(21) Appl. No.: 12/200,614

(22) Filed: Aug. 28, 2008

(65) Prior Publication Data

US 2009/0142966 A1 Jun. 4, 2009

Related U.S. Application Data

(63) Continuation of application No. 10/508,093, filed as application No. PCT/EP03/01717 on Feb. 20, 2003, now Pat. No. 7,419,384.

(51) Int. Cl.
*H01R 12/00* (2006.01)

(52) U.S. Cl. .................................................... 439/76.1

(58) Field of Classification Search ................ 439/76.1, 439/493, 931, 77, 922, 951, 761
See application file for complete search history.

(56) References Cited

U.S. PATENT DOCUMENTS

| | | | | |
|---|---|---|---|---|
| 3,692,966 | A | 9/1972 | Lancaster | |
| 3,740,698 | A | 6/1973 | Jerominek | |
| 4,682,838 | A | 7/1987 | Achtnig et al. | |
| 4,710,419 | A | 12/1987 | Gergory | |
| 4,764,327 | A | 8/1988 | Nozaki et al. | |
| 6,719,570 | B2 | 4/2004 | Tsuchioka | |
| 7,419,384 | B2 * | 9/2008 | Neumetzler et al. | 439/76.1 |

FOREIGN PATENT DOCUMENTS

| | | |
|---|---|---|
| DE | 34 46 622 | 6/1996 |
| EP | 0 743 701 | 11/1996 |
| FR | 2 742 587 | 6/1997 |

* cited by examiner

*Primary Examiner*—Phuong K Dinh
(74) *Attorney, Agent, or Firm*—Merchant & Gould P.C.

(57) ABSTRACT

The invention relates to a plug (11) for terminal blocks in telecommunications and data system equipment, comprising a lower part (1) and an upper part (12) of plastic, which are interconnected, and at least one contact element (5), which can be inserted into a tapping contact of a terminal block, with the lower part (1) being made longer than the upper part (12) and having galvanically metallized structures, which form at least the contact element (5) and extend as far as the lower edge (9) of the lower part (1), and also a method for its production.

17 Claims, 5 Drawing Sheets

7 6.8 6.1 6.2 8.1 5.1 5.2 3 1 7 4 6.12 6.4 6.6 5.5 5.6 9 5.3 5.4 10 2

PLUG FOR CONNECTION STRIPS AND METHOD FOR THE PRODUCTION THEREOF

This is a Continuation of U.S. Ser. No. 10/508,093, filed 12 Apr. 2005, which is a National Stage of PCT/EP03/01717, filed 20 Feb. 2003, which claims priority to 102 11 826.4, filed 16 Mar. 2002, in Germany, and which applications are incorporated herein by reference and a claim of priority to all is made.

TECHNICAL FIELD

The invention relates to a plug for terminal blocks of telecommunications and data systems equipment and a method for its production.

BACKGROUND OF THE INVENTION

Terminal blocks for telecommunications and data systems equipment typically comprise a first row of contact elements for connecting incoming wires and a second row of contact elements for connecting outgoing wires. Arranged between the assigned contact elements of the first and second rows are tapping contacts, into which measuring, test and protective plugs can be inserted. The tapping contacts are designed as connecting or disconnecting contacts. The known test and protective plugs are symmetrically constructed, with the housing of the plug covering the contact elements of the first and second rows of contact elements, so that they are not accessible for activation purposes. If the fitted connecting cord of the measuring or test plug happens to be a temporary patch connection and if the temporary patch connection is to be replaced by permanent jumpering, the subscriber connection must first be disconnected by removing the plug before the permanent jumpering can take place.

A further problem is that, when inserting a measuring, protective or test plug, an already existing connection should not be interrupted, since this would otherwise lead to data losses.

DE 34 46 622 A1 discloses a plug insert of a plug for a terminal block, the one-part plug insert comprising a plurality of punched parts that are electrically isolated from one another and form the interconnects, which are encapsulated in a plastic and are consequently embedded in the plastic. The punched parts are preferably formed such that they widen in the region of insertion. This ensures that the plug can be plugged in and pulled out without causing an interruption. A disadvantage of the known plugs is their relatively complex production.

Furthermore, there are known protective plugs for terminal blocks which can be inserted into connecting or disconnecting contacts of a terminal block and are unsymmetrically formed. These plugs substantially comprise an upper housing part and a printed circuit board, which at the same time closes the housing. As a result, the contact elements assigned to subscribers are freely accessible for a placement tool even when the protective plug is inserted. However, owing to the choice of the printed circuit board as the contact element, these plugs have the disadvantage that they cannot be inserted without causing an interruption on account of the circuit board contour with no edge metallization.

SUMMARY

The invention is therefore based on the technical problem of providing a plug for terminal blocks in telecommunications and data systems equipment which is simple to produce and allows interruption-free insertion in a tapping contact of a terminal block, and also of providing an associated production method.

For this purpose, the plug comprises a lower part and an upper part of plastic, which are interconnected, the lower part being made longer than the upper part, with the lower part having galvanically metallized structures, which form at least the contact element and extend as far as the lower edge of the lower part. This allows the contact element to contact the tapping contact without causing an interruption. On account of the unsymmetrical form of the plug, the contact elements assigned to the subscribers are also freely accessible when the plug is inserted, so that jumpering can be carried out with the plug inserted, without interrupting a patch connection that has possibly an already been set up.

The metallic structures forming the contact elements and/or the lower part preferably have on the lower edge a small bevel, so that the introduction of the contact element is improved, so that interruption-free contacting operation is further improved, since the contact element and the tapping contact are already in contact before the contact springs are mechanically bent apart.

In a further preferred embodiment, the metallic structures additionally comprise interconnects and/or terminal elements for a printed circuit board.

The terminal elements for the printed circuit board are preferably formed as metallized cylinders which engage in metallized holes of a printed circuit board and contact the latter. Then, according to requirements, various components and/or functional groups can be arranged on the printed circuit board.

The printed circuit board is in this case preferably arranged in the overlapping region of the upper part and lower part, so that it is protected against physical contact and mechanical impact.

In a further preferred embodiment, the length of the lower part and upper part is chosen such that, in the inserted state, the contacts of the terminal block that are facing the lower part are accessible for a placement tool.

BRIEF DESCRIPTION OF THE DRAWINGS

The invention is explained in more detail below on the basis of a preferred exemplary embodiment. In the figures.

DETAILED DESCRIPTION OF THE PREFERRED EMBODIMENTS

Figure 1:
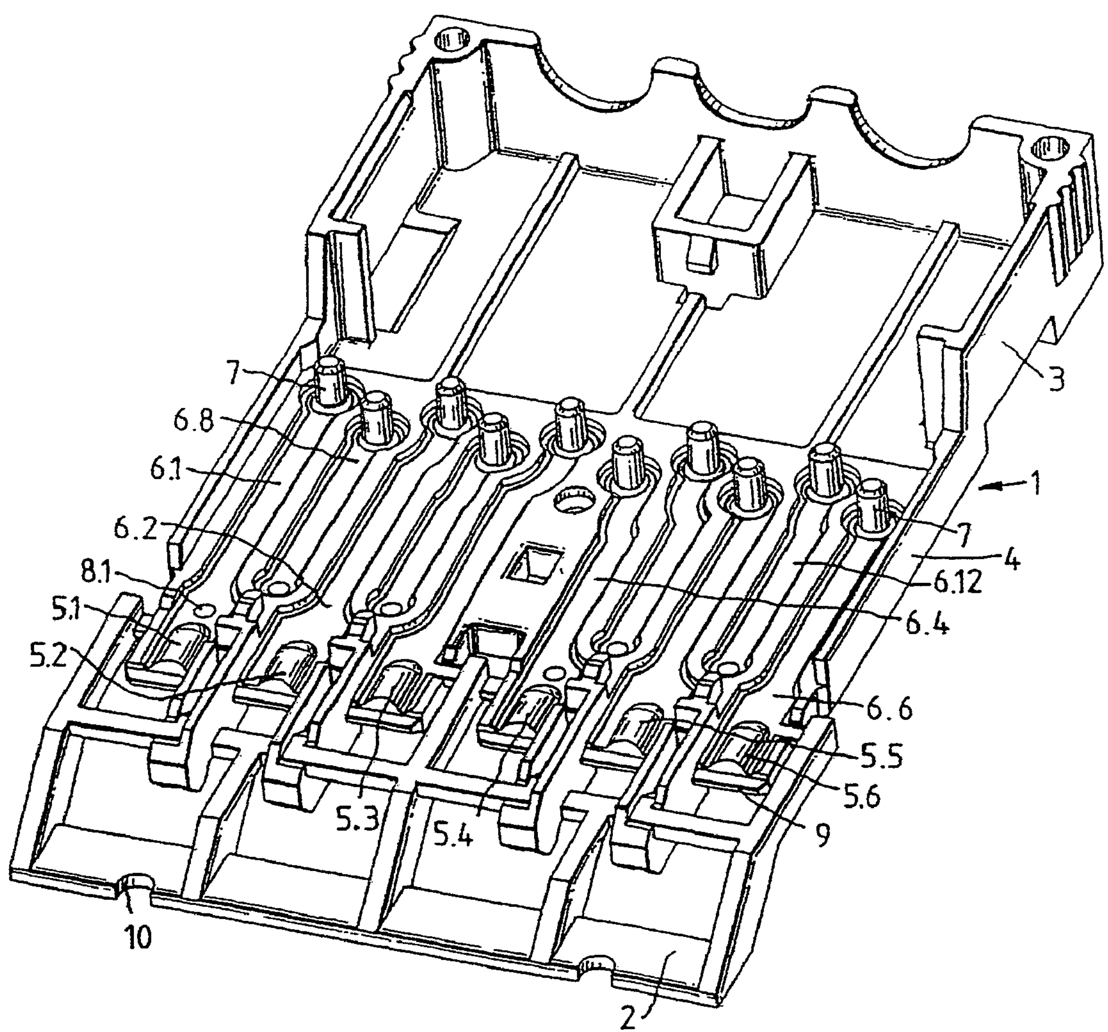
FIG. 1 shows a perspective plan view of a lower part with a galvanic link.
Figure 2:
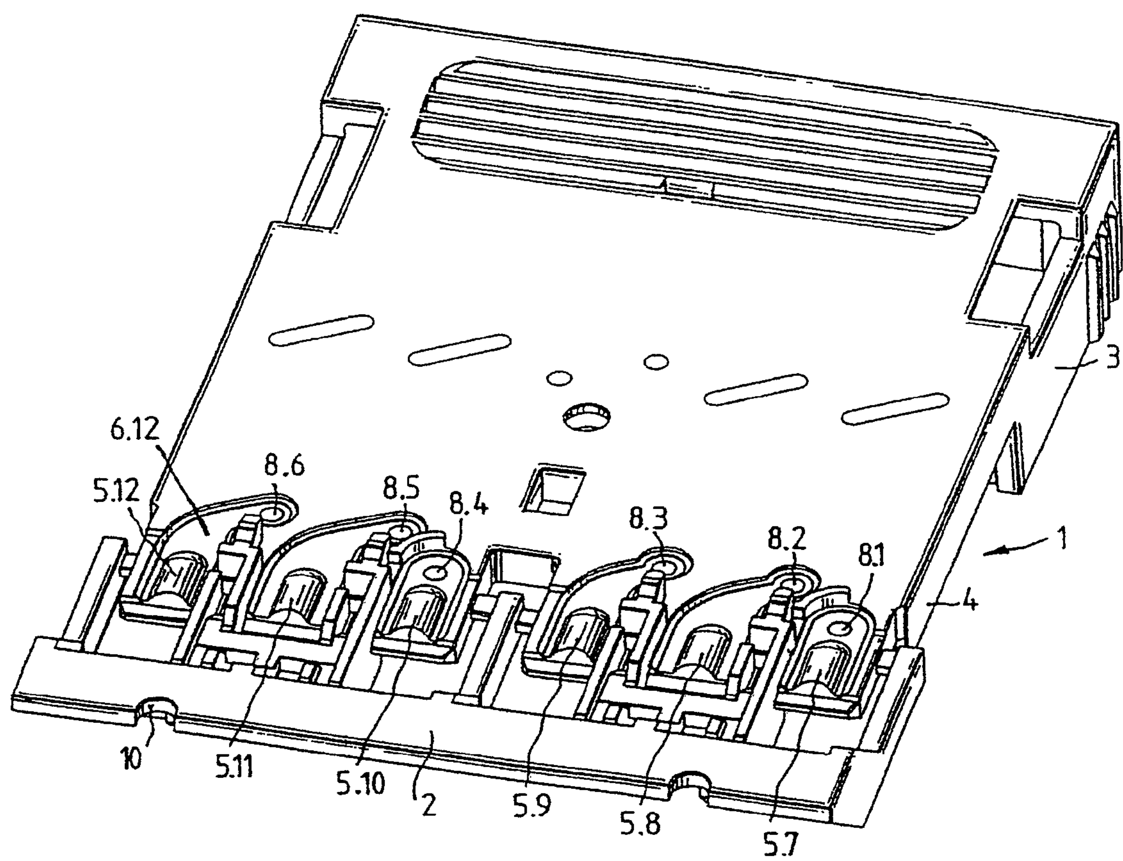
FIG. 2 shows a perspective bottom view of the lower part with the galvanic link.

In FIGS. 1 and 2, a plan view and a bottom view of a lower part 1 with a galvanic link 2 are perspectively represented. The lower part 1 is in this case made up as one piece by a basic body 3 and a core part 4 to be metallized. The core part 4 comprises metallized structures, which are formed as contact elements 5, interconnects 6 and terminal elements 7 and are galvanically reinforced. For this purpose, for example, the lower part 1 is produced in a two-shot injection-molding process, with a metallizable, pretreated plastic being injected by means of the first shot and the basic body 3 being molded by means of the second shot, with the later contact elements 5, interconnects 6 and terminal elements 7 remaining free. On these exposed surfaces, a basic metallization is built up in a chemical process. Subsequently, the lower part 1 is attached by means of the electrically conducting galvanic link 2 to a supporting frame, which is connected to a voltage source, whereas the lower part 1 is immersed in an electrolytic bath in which the counterelectrode is located. During the subsequent flow of current, metal is then deposited at the locations at which the base metallization previously took place, with only the surfaces which are connected in an electrically conducting manner to the supporting frame being reinforced. Subsequently, the galvanic link 2 can be removed from the lower part 1. In FIG. 1, the lower part 1 after galvanizing is represented, with six contact elements 5 having been respectively deposited on the upper side and lower side of the lower part 1 for a 12-pin plug. The contact elements 5 are then connected via the interconnects 6 to the terminal elements 7, which are formed as metallized cylinder pins. The contact elements 5 and the lower edge 9 of the lower part 1 are slightly beveled in each case. For better connection of the galvanic link 2 to the supporting frame (not represented), said link is formed with matching clearances 10.

Depending on the intended use of the plug, the contact elements on the upper side and underside can be interconnected by metallized drill holes 8.1 to 8.6. In the embodiment represented for connecting up two shielded twin wires, the contact elements 5.1 and 5.2 assigned to the shieldings are interconnected on the upper side with the associated contact elements 5.7 and 5.10, on the underside by the drill holes 8.1 and 8.4 and are connected to the common terminal elements 7 via the interconnects 6.1 or 6.4, respectively. The remaining contact elements 5.2, 5.3, 5.5, 5.6, 5.8, 5.9, 5.11 and 5.12, on the other hand, are led separately to a terminal element 7 of their own, so that the separation of the potentials into the system side and the subscriber side allows measurement to be carried out. For this purpose, the potentials of the contact elements 5.8, 5.9, 5.11 and 5.12 are led through the plated-through drill holes 8.2 and 8.3 or 8.5 and 8.6, respectively, to the upper side of the lower part 1, where the electrical connection to the terminal elements 7 is then established via interconnects 6. For reasons of clarity, the index on the contact elements 5, the drill holes 8 and interconnects 6 is omitted hereafter.

Figure 3:
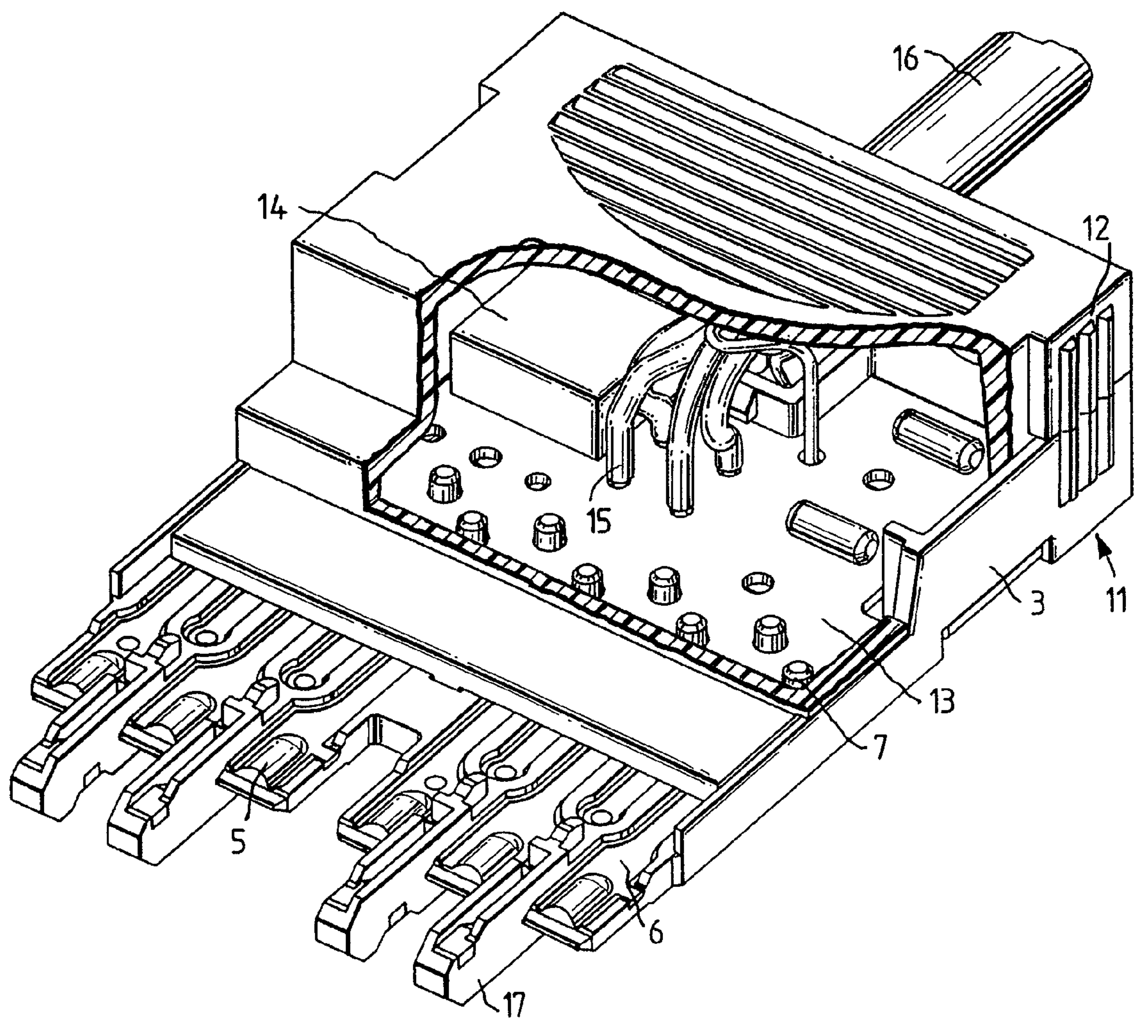
FIG. 3 shows a perspective plan view of the complete plug.
Figure 4:
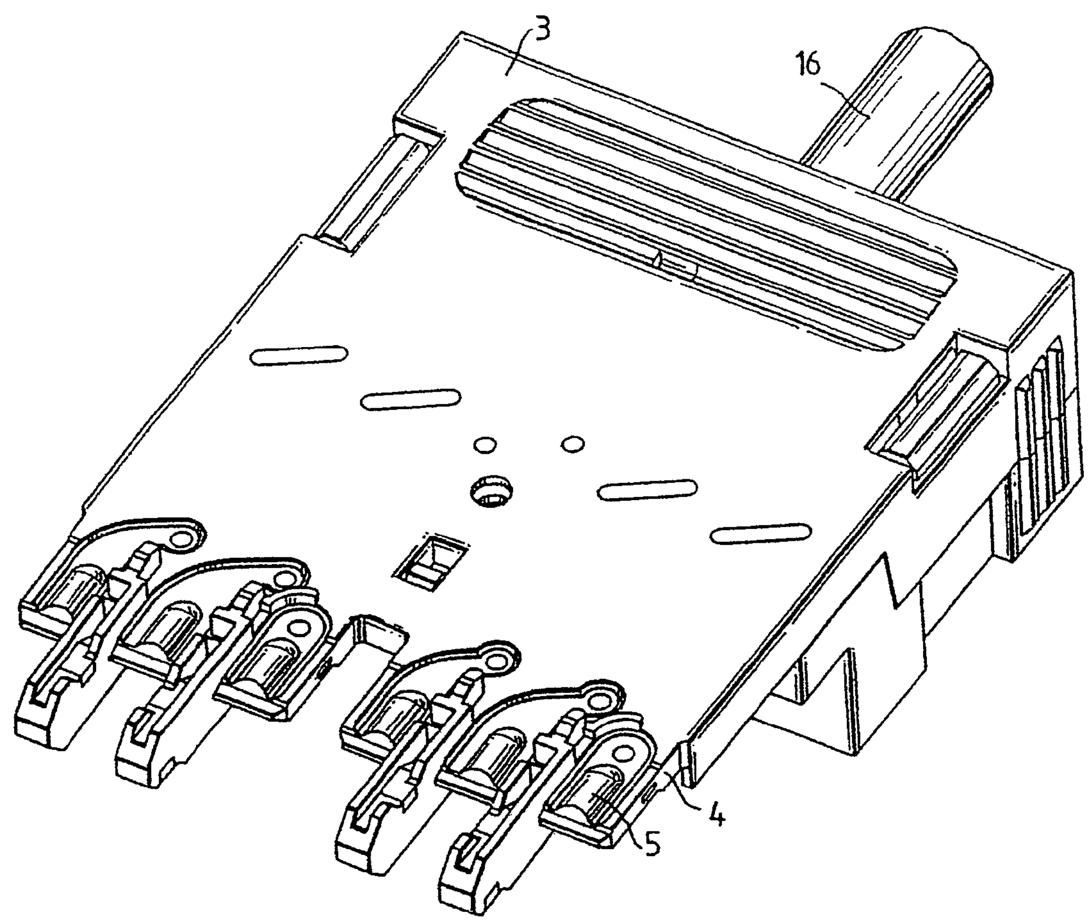
FIG. 4 shows a perspective bottom view of the plug.

In FIGS. 3 and 4, the fully assembled plug 11 is respectively represented. Along with the already described lower part 1, the plug 11 comprises an upper part 12, which is made shorter than the lower part 1. The upper part 12 is in this case connected to the basic body 3 of the lower part 1. Before the upper part 12 and lower part 1 are put together, a printed circuit board 13, which can be seen in FIG. 3 through the depicted aperture in the upper part 12, is fitted into the lower part 1. The printed circuit board 13 is formed with metallized holes, through which the terminal elements 7 are led. As a result, the printed circuit board 13 is electrically connected to the contact elements 5. On the printed circuit board 13, functional modules 14 are arranged and leads 15 of a patch cable 16 are soldered. The printed circuit board 13 is then completely protected by the upper part 12 and the basic body 3 of the lower part 1. The remaining webs 17 of the removed galvanic link no longer have any functional purpose, but they are useful as an aid for introducing the plug 11 into the tapping contacts of the terminal block.

Figure 5:
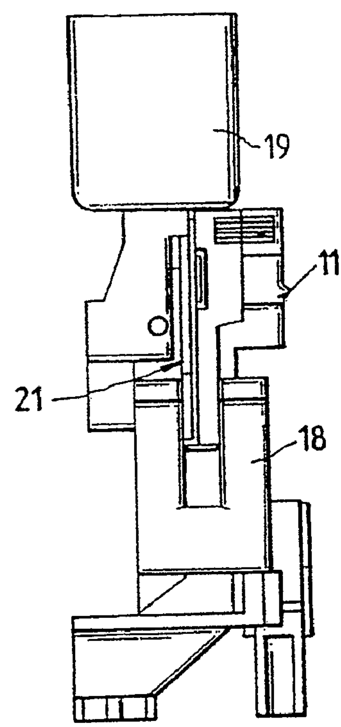
FIG. 5 shows a side view of a terminal block with inserted plug and applied placement tool and FIG. 6 shows a perspective representation of the terminal block according to FIG. 5.
Figure 6:
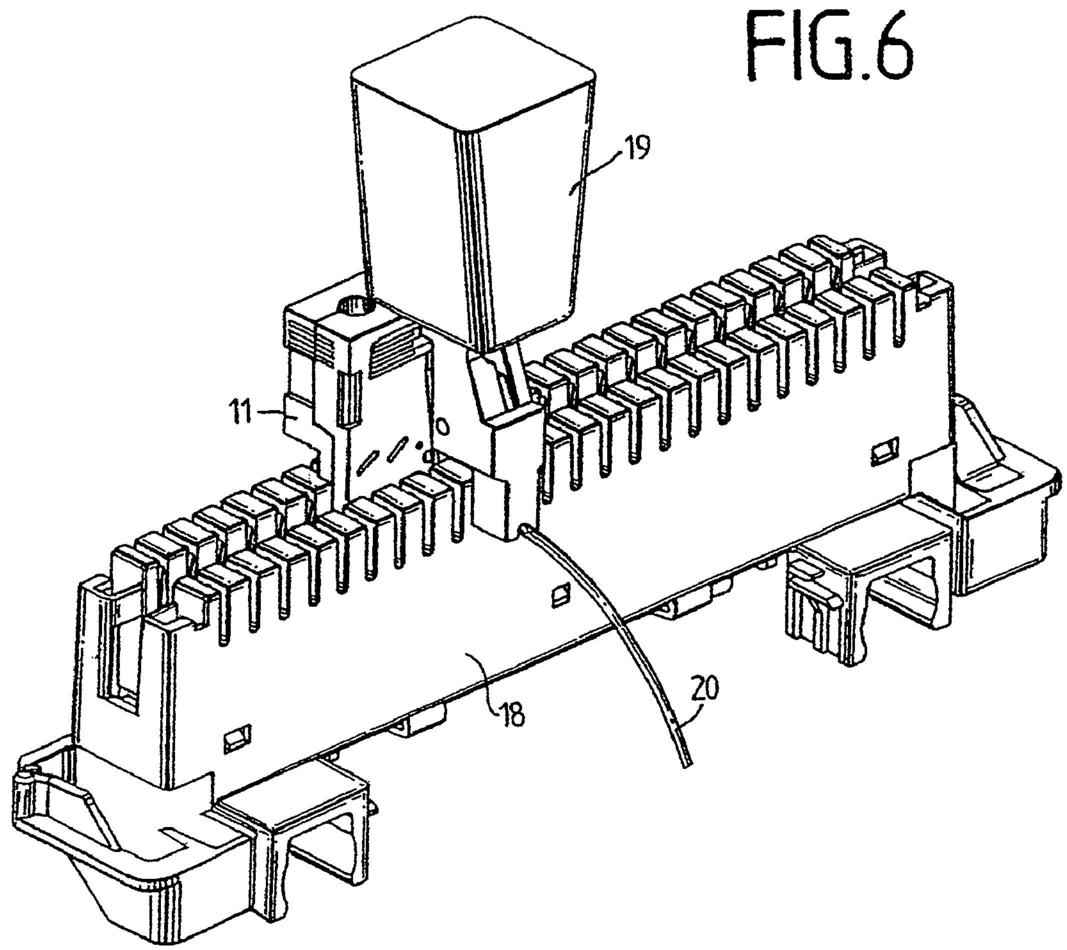

In FIGS. 5 and 6, the inserted plug 11 in the terminal block 18 is represented. Furthermore, a placement tool 19 for jumpering a wire 12 has been put in place. On account of the unsymmetrical form of the plug 11 and the length of the upper part 12, the contacts of the terminal block 18 that are facing the lower part 1 are freely accessible and can be connected up to a wire 20. For this purpose, an activating blade 21 of the placement tool 19 presses the wire 20 into an insulation-displacement contact, where it then forms an electrical connection.

List of Reference Numerals

1 lower part
2 link
3 basic body
4 core part
5.1 to 5.12 contact element
6 interconnects
7 terminal elements
8.1 to 8.6 drill holes
9 edge
10 clearances
11 plug
12 upper part
13 printed circuit board
14 functional elements
15 leads
16 patch cable
17 webs
18 terminal block
19 placement tool
20 wire
21 activating blade

The invention claimed is:

1. A plug for terminal blocks in telecommunications and data system equipment, the plug comprising a lower part of plastic and an upper part of plastic, the lower part and the upper part being interconnected and the lower part being longer than the upper part and formed from a unitary piece of plastic, and the plug further including at least one contact element, which can be inserted into a tapping contact of a terminal block, with the at least one contact element formed on the lower part, the plug further including galvanically metallized structures, which form at least the contact element and extend as far as a lower edge of the lower part.

2. The plug as claimed in claim 1, wherein the metallized structures at the lower edge have a bevel.

3. The plug as claimed in claim 1, wherein the metallized structures comprise terminal elements for a printed circuit board.

4. The plug as claimed in claim 3, wherein the terminal elements are formed as metallized cylinders, which engage in metallized holes of a printed circuit board and contact the metallized holes.

5. The plug as claimed in claim 3, wherein the printed circuit board is arranged between overlapping and interconnected regions of the upper part and lower part.

6. The plug as claimed in claim 1, wherein the relative lengths of the lower part and upper part are chosen such that, in the inserted state, the contacts of the terminal block that are facing the lower part are accessible for a placement tool.

7. A plug for terminal blocks in telecommunications and data system equipment, the plug comprising:

a first plastic piece;

a second plastic piece interconnected to the first plastic piece to form a housing, the housing including an interior, the second plastic piece including an insertion portion extending beyond the first plastic piece and configured to be inserted into a terminal block;

a printed circuit board positioned within the interior and electrically connected to a plurality of cylinder pins extending from the second plastic piece within the interior; and a plurality of galvanically metallized contact elements directly formed on the second plastic piece and at least partially on the insertion portion extending beyond the first plastic piece, the plurality of galvanically metalized contact elements connecting to the plurality of cylinder pins and extending to an edge of the insertion portion of the second plastic piece.

8. The plug of claim 7, wherein the portion of the second plastic piece having the plurality of galvanically metalized contact elements deposited thereon is configured such that, when inserted into a terminal block, the contacts of the terminal block are accessible for a placement tool.

9. The plug of claim 7, wherein the printed circuit board is enclosed within the interior.

10. The plug of claim 7, wherein the galvanically metalized contact elements include a bevel at the edge of the insertion portion.

11. The plug of claim 7, wherein the plurality of cylinder pins are configured for insertion into metalized holes in the printed circuit board.

12. The plug of claim 7, further comprising a plurality of electrical components included on the printed circuit board within the interior of the housing.

13. The plug of claim 7, wherein the plurality of galvanically metallized contact elements includes at least six contact elements.

14. The plug of claim 7, further comprising a patch cable electrically connected to the printed circuit board and extending from the housing formed by the first plastic piece and the second plastic piece.

15. The plug of claim 14, wherein the insertion portion is configured to be inserted into an insulation displacement contact in a terminal block.

16. The plug of claim 7, further comprising a plurality of webs extending from the edge of the insertion portion, the webs providing guidance for inserting the plug into a terminal block.

17. A plug for terminal blocks in telecommunications and data system equipment, the plug comprising:

a first unitary plastic piece;

a second unitary plastic piece interconnected to the first plastic piece to form a housing, the housing including an interior, the second plastic piece including an insertion portion extending beyond the first plastic piece and configured to be inserted into a terminal block;

a printed circuit board positioned within the interior and electrically connected at a plurality of metalized holes in the printed circuit board to a plurality of cylinder pins extending from the second plastic piece within the interior; and a plurality of galvanically metallized contact elements directly formed on the second plastic piece and at least partially on the insertion portion extending beyond the first plastic piece, the plurality of galvanically metalized contact elements connecting to the plurality of cylinder pins and extending to an edge of the insertion portion of the second plastic piece to form contact elements, each contact element including a bevel at the edge.

* * * * *

UNITED STATES PATENT AND TRADEMARK OFFICE

CERTIFICATE OF CORRECTION

PATENT NO. : 7,744,378 B2
APPLICATION NO. : 12/200614
DATED : June 29, 2010
INVENTOR(S) : Neumetzler et al.

It is certified that error appears in the above-identified patent and that said Letters Patent is hereby corrected as shown below:

Title page, insert the following omitted Foreign Application Priority Data:

--(30) Foreign Application Priority Data

Mar. 16, 2002 (DE) ............................ 102 11 826--

Signed and Sealed this

Thirtieth Day of November, 2010

David J. Kappos

*Director of the United States Patent and Trademark Office*